United States Patent
Guzek et al.

(10) Patent No.: US 7,288,459 B2
(45) Date of Patent: Oct. 30, 2007

(54) ORGANIC SUBSTRATES WITH INTEGRAL THIN-FILM CAPACITORS, METHODS OF MAKING SAME, AND SYSTEMS CONTAINING SAME

(75) Inventors: John S. Guzek, Chandler, AZ (US); Victor Prokofiev, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 87 days.

(21) Appl. No.: 11/095,917

(22) Filed: Mar. 31, 2005

(65) Prior Publication Data

US 2006/0223226 A1    Oct. 5, 2006

(51) Int. Cl.
*H01L 21/20* (2006.01)
(52) U.S. Cl. ...................... 438/381; 257/532
(58) Field of Classification Search ................ 438/171, 438/210, 254, 259, 397, 381, 393; 257/532, 257/565
See application file for complete search history.

(56) References Cited

U.S. PATENT DOCUMENTS

| | | | |
|---|---|---|---|
| 4,890,192 A | 12/1989 | Smith | |
| 5,745,334 A | 4/1998 | Hoffarth et al. | |
| 5,800,575 A | 9/1998 | Lucas | |
| 6,236,102 B1 | 5/2001 | Kim et al. | |
| 6,339,527 B1 | 1/2002 | Farooq et al. | |
| 6,368,514 B1 * | 4/2002 | Metzler | 216/6 |
| 6,433,993 B1 | 8/2002 | Hunt et al. | |
| 6,448,628 B2 | 9/2002 | Chern et al. | |
| 6,459,117 B1 | 10/2002 | Liou | |
| 6,477,036 B2 | 11/2002 | Kitagawa et al. | |
| 6,605,515 B2 | 8/2003 | Kitagawa et al. | |
| 6,739,027 B1 | 5/2004 | Lauffer et al. | |
| 6,749,928 B2 | 6/2004 | Takaya et al. | |
| 6,754,952 B2 | 6/2004 | Takano et al. | |
| 6,897,508 B2 | 5/2005 | Sneh | |
| 6,910,266 B2 | 6/2005 | Lee et al. | |
| 6,928,726 B2 | 8/2005 | Zollo et al. | |
| 7,027,289 B2 | 4/2006 | He et al. | |
| 2001/0019144 A1 * | 9/2001 | Roy | 257/296 |
| 2004/0196620 A1 | 10/2004 | Knudsen et al. | |
| 2004/0257749 A1 * | 12/2004 | Otsuka et al. | 361/306.3 |
| 2005/0269128 A1 * | 12/2005 | Usui et al. | 174/256 |
| 2006/0143886 A1 | 7/2006 | Srinivasan et al. | |
| 2006/0220175 A1 | 10/2006 | Guzek et al. | |

* cited by examiner

*Primary Examiner*—S. V. Clark
(74) *Attorney, Agent, or Firm*—Schwegman, Lundberg & Woessner, P.A.

(57) ABSTRACT

An organic substrate, thin-film capacitor composite includes two plates that are accessed through deep and shallow vias. The organic substrate, thin-film capacitor composite includes integral structure with at least one trace in the organic substrate. The composite is able to be coupled with an interposer. The composite is also part of computing system.

26 Claims, 8 Drawing Sheets

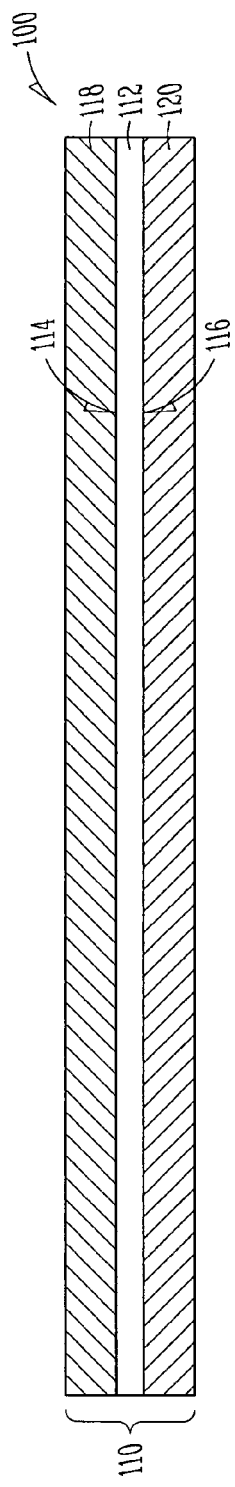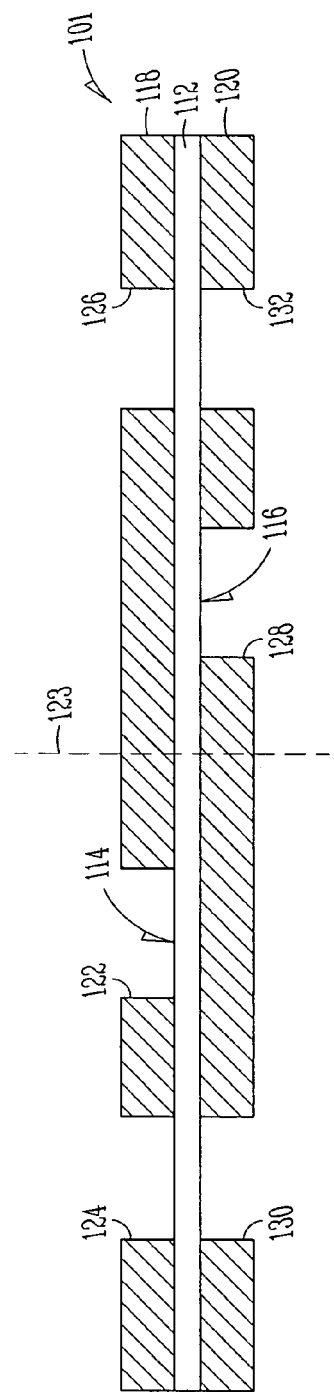
FIG. 1A
FIG. 1B

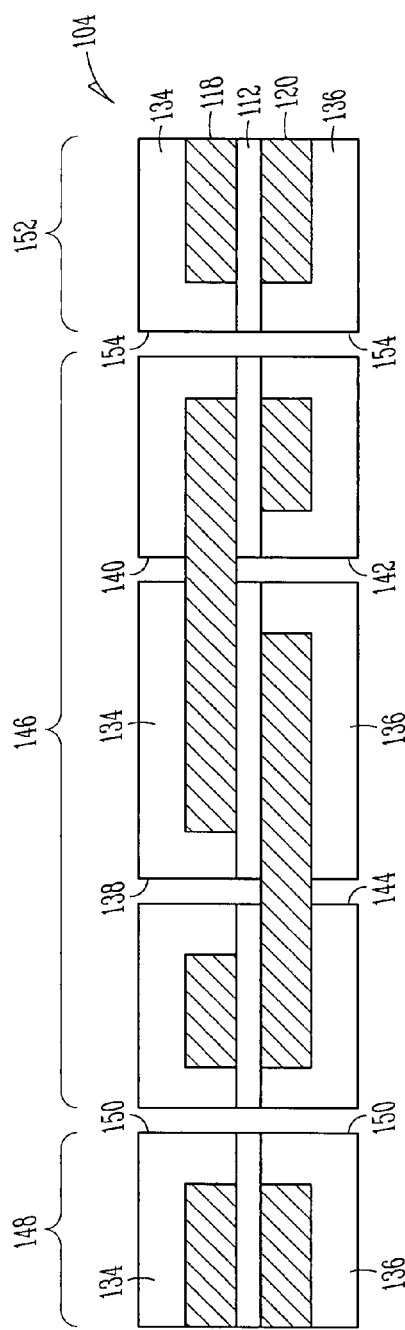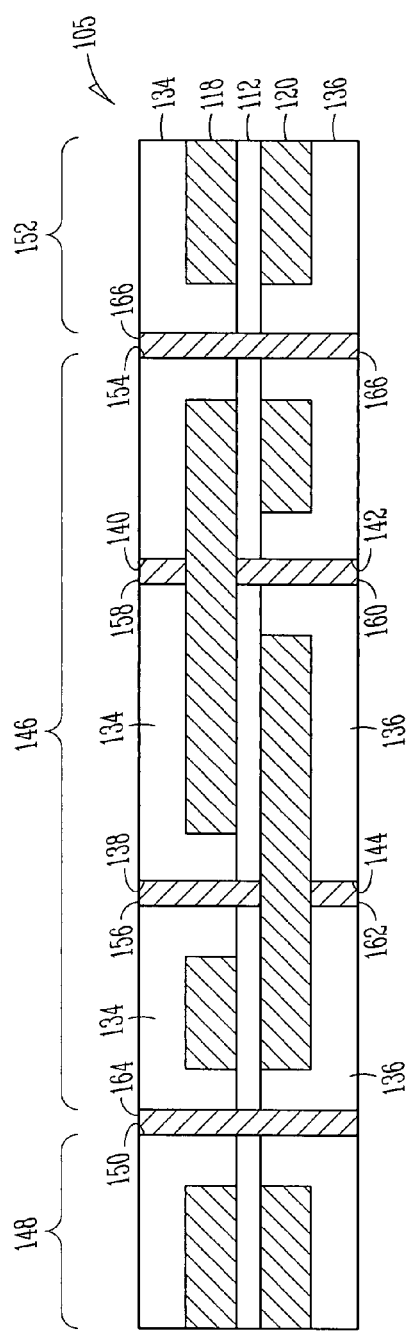

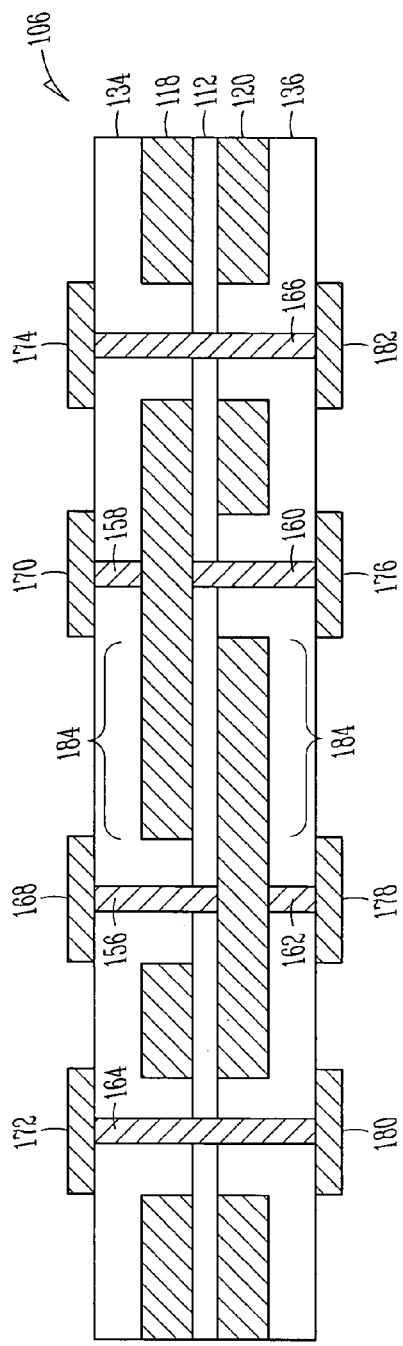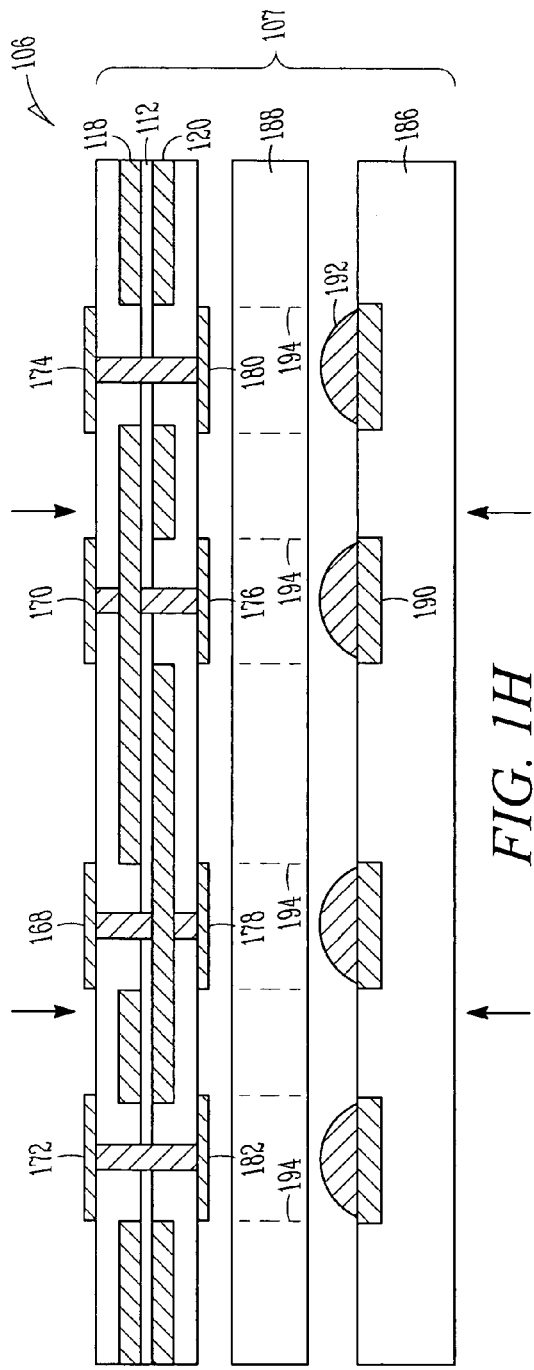

ORGANIC SUBSTRATES WITH INTEGRAL THIN-FILM CAPACITORS, METHODS OF MAKING SAME, AND SYSTEMS CONTAINING SAME

TECHNICAL FIELD

Disclosed embodiments relate to a thin-film plate capacitor assembly.

BACKGROUND INFORMATION

A microelectronic die often requires capacitative power sources to respond to transient loads generated during operation. Capacitors are provided to answer the transient load requirements of the die.

Power delivery is a significant concern in the design and operation of a microelectronic device. Where the microelectronic device is a processor or an application-specific integrated circuit (ASIC), an adequate current delivery, a steady voltage, and an acceptable processor transient response are desirable characteristics of the overall microelectronic device package. One of the methods for responding to a processor transient is to place a high-performance capacitor close to the processor to shorten the transient response time. Although a large-capacity and high-performance capacitor is preferable to answer the processor transients, the capacitor is in competition for space in the immediate vicinity of the processor.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which:

FIG. 1A is a cross-section elevation of an organic substrate thin-film capacitor composite during processing according to an embodiment;

FIG. 1B is a cross-section of the organic substrate thin-film capacitor composite depicted in FIG. 1A during further processing according to an embodiment;

FIG. 1E is a cross-section of the organic substrate thin-film capacitor composite depicted in FIG. 1D during power and/or signal via processing according to an embodiment;

FIG. 1F is a cross-section of the organic substrate thin-film capacitor composite depicted in FIG. 1E during contact processing according to an embodiment;

FIG. 1G is a cross-section of the organic substrate thin-film capacitor composite depicted in FIG. 1F during electronic terminal processing according to an embodiment;

FIG. 1H is a cross-section of the organic substrate thin-film capacitor composite depicted in FIG. 1F during assembly according to an embodiment;

DETAILED DESCRIPTION

Figure 1C:
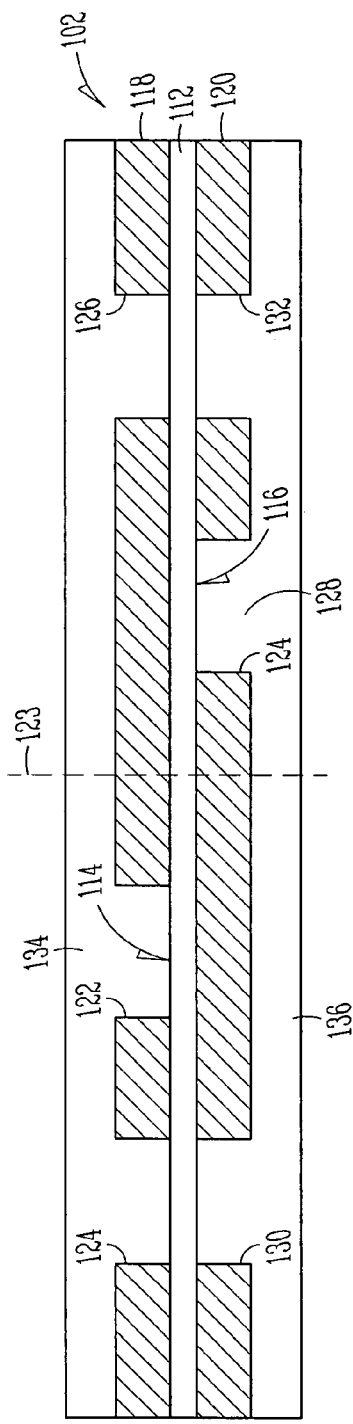
FIG. 1C is a cross-section of the organic substrate thin-film capacitor composite depicted in FIG. 1B during further processing according to an embodiment.

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

FIG. 1A is a cross-section elevation of an organic substrate thin-film capacitor composite (OS TFCC) 100 during processing according to an embodiment. The OS TFCC 100 includes a laminate 110. The laminate 110 includes a dielectric center film 112 with an upper side 114 and a lower side 116. In an embodiment, the laminate 110 includes an upper plate 118. In an embodiment, the laminate 110 includes the upper plate 118 on the upper side 114 and a lower plate 120 on the lower side 116.

In an embodiment, the upper plate 118 and the lower plate 120 are made of copper, copper alloys, and the like. In an embodiment, the upper plate 118 and the lower plate 120 are made of nickel, nickel alloys, and the like. In an embodiment, the upper plate 118 and the lower plate 120 are made of platinum, platinum alloys, and the like. In an embodiment, the upper plate 118 and the lower plate 120 are made of palladium, palladium alloys, and the like.

In an embodiment, the dielectric center film 112 is made of a low-K inorganic material such as barium strontium titanate (BST). In an embodiment, the dielectric center film 112 is made of an organic material such as a resin. In an embodiment, the dielectric center film 112 is a thermosetting resin. In an embodiment, the dielectric center film 112 is a thermoplastic resin. In an embodiment, the dielectric center film 112 is a material such as a poly tetrafluoro ethylene (PTFE).

FIG. 1B is a cross-section of the organic substrate thin-film capacitor composite depicted in FIG. 1A during further processing according to an embodiment. The OS TFCC 101 has been processed to achieve an upper first recess 122 in the upper plate 118 that exposes the upper side 114. In an embodiment, the OS TFCC 101 has been processed to achieve the upper first recess 122 in the upper plate 118 that exposes the upper side 114, and an upper second recess 124 that likewise exposes the upper side 114. Further in an embodiment, the OS TFCC 101 has been processed to achieve an upper third recess 126 in the upper plate 118 that likewise exposes the upper side 114.

In an embodiment, the OS TFCC 101 has been processed to achieve a lower first recess 128 in the lower plate 120 that exposes the lower side 116. In an embodiment, the OS TFCC 101 has been processed to achieve the lower first recess 128 in the lower plate 120 that exposes the lower side 114, and a lower second recess 130 that likewise exposes the lower side 120. Further in an embodiment, the OS TFCC 101 has been processed to achieve a lower third recess 132 in the lower plate 120 that likewise exposes the lower side 120.

In an embodiment, the upper first recess 122 and the lower first recess 118 are offset with respect to a symmetry line 123.

FIG. 1C is a cross-section of the organic substrate thin-film capacitor composite depicted in FIG. 1B during further processing according to an embodiment. The OS TFCC 102 has been processed to achieve an upper first film 134 over the upper plate 118. In an embodiment, the OS TFCC 102 has been processed to achieve the upper first film 134 over the upper plate 118 and a lower first film 136 over the lower plate 120. In an embodiment, the upper first film 134 is a dielectric organic, such as any of the dielectric materials, and the like, that are used for the dielectric center film 112 as set forth herein.

Figure 1D:
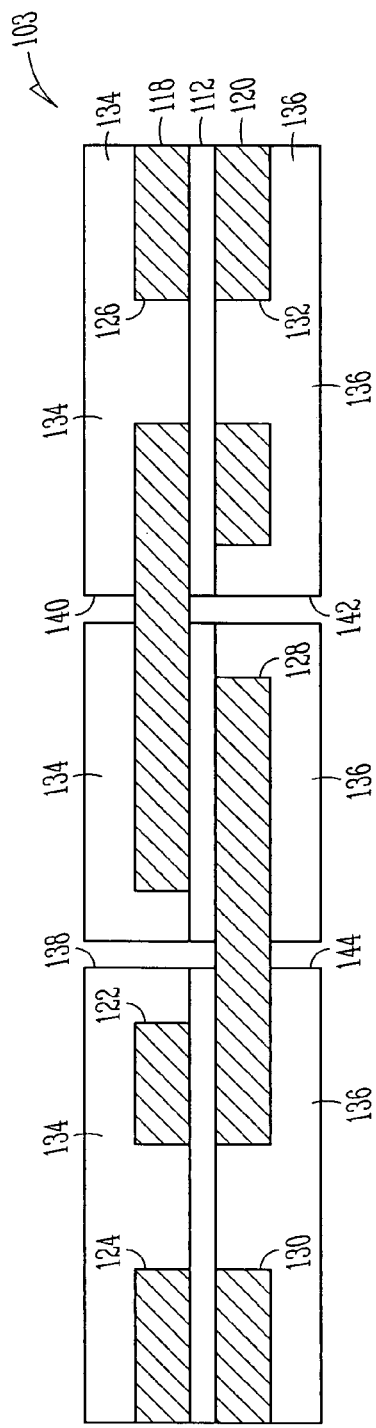
FIG. 1D is a cross-section of the organic substrate thin-film capacitor composite depicted in FIG. 1C during further processing according to an embodiment.

FIG. 1D is a cross-section of the organic substrate thin-film capacitor composite depicted in FIG. 1C during further processing according to an embodiment. The OS TFCC 103 has been further processed to achieve a capacitor deep upper via 138 in the upper first recess 122 that also exposes the lower plate 120 at the bottom of the capacitor deep upper via 138. In an embodiment, the OS TFCC assembly 103 has been further processed to achieve the capacitor deep upper via 138 in the first recess 122 and a capacitor shallow upper via 140 in the upper first film 134 and that also exposes the upper plate 118 at the bottom of the capacitor shallow first via 140.

In an embodiment, the OS TFCC 103 has been processed to achieve a capacitor deep lower via 142 in the lower first recess 128 that also exposes the upper plate 118 at the bottom of the capacitor deep lower via 142. In an embodiment, the OS TFCC 103 has been further processed to achieve the capacitor deep lower via 142 in the lower first recess 128 and a capacitor shallow lower via 144 in the lower first film 136 and that also exposes the upper plate 118 at the bottom of the capacitor shallow lower via 144.

FIG. 1E is a cross-section of the organic substrate thin-film capacitor composite depicted in FIG. 1D during power and/or signal via processing according to an embodiment. In a first region 146, the OS TFCC 104 illustrates a capacitor structure, including the upper plate 118, the lower plate 120, and electronic terminal access with at least the capacitor deep upper via 138 and the capacitor deep lower via 142. In a second region 148, the OS TFCC 104 has been further processed to achieve a first through-hole via 150 that can be adjacent to the first region 146 in an embodiment. The second region 148 is prepared for electronic communication that is spaced apart from the first region 146. In an embodiment, the first through-hole via 150 is configured for power transmission. In an embodiment, the first through-hole via 150 is configured for I/O signal transmission.

In a third region 152, the OS TFCC 104 has been further processed to achieve a second through-hole via 152 that can be adjacent to the first region 146 in an embodiment. The third region 152 is prepared for electronic communication that is spaced apart from the first region 146. In an embodiment, the second through-hole via 154 is configured for power transmission. In an embodiment, the second through-hole via 154 is configured for I/O signal transmission.

In an embodiment, the second region 148 is configured for a dedicated purpose such as power transmission, while the third region 152 is likewise configured for a dedicated purpose such as power transmission. In an embodiment, the second region 148 is configured for a dedicated purpose such as I/O signal I/O signal transmission, while the third region 152 is likewise configured for a dedicated purpose such as I/O signal transmission. In an embodiment, the second region 148 is configured for a dedicated purpose such as I/O signal transmission, while the third region 152, if present, is likewise configured for a dedicated purpose such as power transmission, or vice versa. In an embodiment, the second region 148 is configured for a mixed purpose such as both I/O signal transmission and power transmission, and the third region 152 is likewise configured for a mixed purpose such as both I/O signal transmission and power transmission.

In an embodiment, the OS TFCC 104 is part of a structure that surmounts an interposer. In an embodiment, the OS TFCC 104 is part of a structure that is surmounted by a die. In an embodiment, the OS TFCC 104 is part of a structure that surmounts an interposer and that is likewise surmounted by a die.

FIG. 1F is a cross-section of the organic substrate thin-film capacitor composite depicted in FIG. 1E during contact processing according to an embodiment. The OS TFCC 105 has been further processed to achieve a deep upper contact 156 in the capacitor deep upper via 138. In an embodiment, the OS TFCC 105 has been further processed to achieve the deep upper contact 156 in the capacitor deep upper via 138, and a shallow upper contact 158 in the shallow upper via 140.

In an embodiment, the OS TFCC 105 has been further processed to achieve a deep lower contact 160 in the deep lower via 142. In an embodiment, the OS TFCC 105 has been further processed to achieve the deep lower contact 160 in the deep lower via 142, and a shallow lower contact 162 in the shallow lower via 144.

Contact processing also includes forming a first through-hole contact 164 in the first through-hole 150. In an embodiment, processing also includes forming the first through-hole contact 164 in the first through-hole 150, and a second through-hole contact 166 in the second through-hole 154.

Formation of the contacts can be done by electroplating. In an embodiment, the upper plate 118 is connected as a cathode in an electroplating environment. In an embodiment, the upper plate 118 and the lower plate 120 are connected as cathodes in an electroplating environment.

FIG. 1G is a cross-section of the organic substrate thin-film capacitor composite depicted in FIG. 1F during electronic terminal processing according to an embodiment. The OS TFCC 106 has been further processed to achieve terminals for electronic communication and capacitance discharge therethrough. On the upper side of the OS TFCC 106 as depicted, the OS TFCC 106 includes a capacitor upper first terminal 168 at the capacitor deep upper contact 156, a capacitor upper second terminal 170 at the capacitor shallow upper contact 158, a through-hole upper first terminal 172 in contact with the through-hole first contact 164, and a through-hole upper second terminal 174 in contact with the through-hole second contact 166. On the lower side, the OS TFCC 106 includes a capacitor lower first terminal 176 at the capacitor deep lower contact 160, a capacitor lower second terminal 178 at the capacitor shallow lower contact 162, a through-hole lower first terminal 180 in contact with the through-hole first contact 164, and a through-hole lower second terminal 182 in contact with the through-hole second contact 166.

As depicted in FIG. 1G, the OS TFCC 106 includes a TFC plate surface area 184 between a portion of the upper plate 118 and the lower plate 120. The TFC plate surface area 184 is used to generate a capacitance charge by developing a potential between the capacitor upper plate 118 and the capacitor lower plate 120.

Formation of the terminals can be done by electroplating. In an embodiment, the upper terminals are connected as a cathode in an electroplating environment.

FIG. 1H is a cross-section of the organic substrate thin-film capacitor composite depicted in FIG. 1G during assembly according to an embodiment. A package 107 is being processed by bringing the OS TFCC 106 together with a substrate 186. In an embodiment, the substrate 186 is part of a printed wiring board (PWB) such as a main board. In an embodiment, the substrate 186 is part of an interposer. In an embodiment, the substrate 186 is part of a mezzanine PWB. In an embodiment, the substrate 186 is part of an expansion card PWB. In an embodiment, the substrate 186 is part of a small PWB such as a board for a handheld device such as a cell phone or personal digital assistant (PDA).

The OS TFCC 107, as depicted by the directional arrows, is being brought together with the substrate 186. A polymer film 188 is placed between the OS TFCC 107 and the substrate 186 during processing. In an embodiment, the polymer film 188 is a B-staged polymer that allows for penetration of rigid objects. FIG. 1H depicts a substrate bond pad 190 and a bump 192 disposed on the substrate bond pad 190. In an embodiment, the polymer film 188 is sufficiently pliant during processing such that the bump 192 penetrates the polymer film 188 and contacts the terminals 176, 178, 180, and 182.

In an embodiment, the polymer film 188 has been pre-patterned with a film recess 194, which is depicted in phantom lines therein. Thereby, penetration of the bump 192 into the polymer film 188 is facilitated, to make contact with the terminals 176, 178, 180, and 182. In an embodiment, the polymer film 188 has been pre-patterned with the film recess 194 as a virtual recess. By "virtual recess" it is meant that the region in the virtual recess includes a polymer material, but that the remainder of the polymer film 188 includes inorganic particulates that assist in achieving a given coefficient of thermal expansion (CTE). Thereby, penetration of the bump 192 into the polymer film 188 is facilitated without any particulates becoming entrapped between bump 192 and pad 183. In an embodiment, the bump 192 is a solder paste during the processing depicted in FIG. 1G.

Figure 1J:
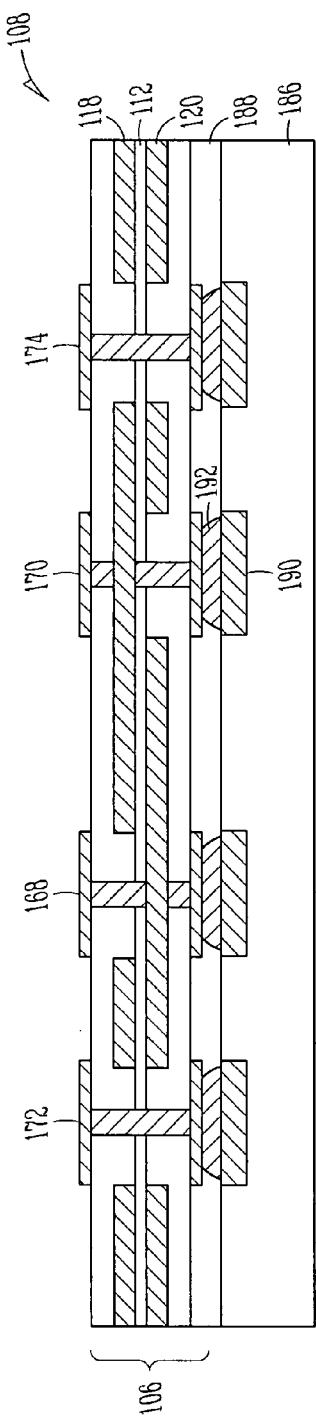
FIG. 1J is a cross-section of the organic substrate thin-film capacitor composite depicted in FIG. 1H during further assembly according to an embodiment.

FIG. 1J is a cross-section of the organic substrate thin-film capacitor composite depicted in FIG. 1H during further assembly according to an embodiment. The OS TFCC 108 is being further processed by heating and/or pressing the various structures. In an embodiment, the bump 192 is reflowed, followed by curing of the polymer film 188. In an embodiment, the polymer film 188 is cured, followed by reflowing of the bump 192. In an embodiment, curing of the polymer film 188 and reflowing of the bump 192 are carried out in a single heating tool. In an embodiment, curing of the polymer film 188 and reflowing of the bump 192 are carried out substantially simultaneously.

Figure 2:
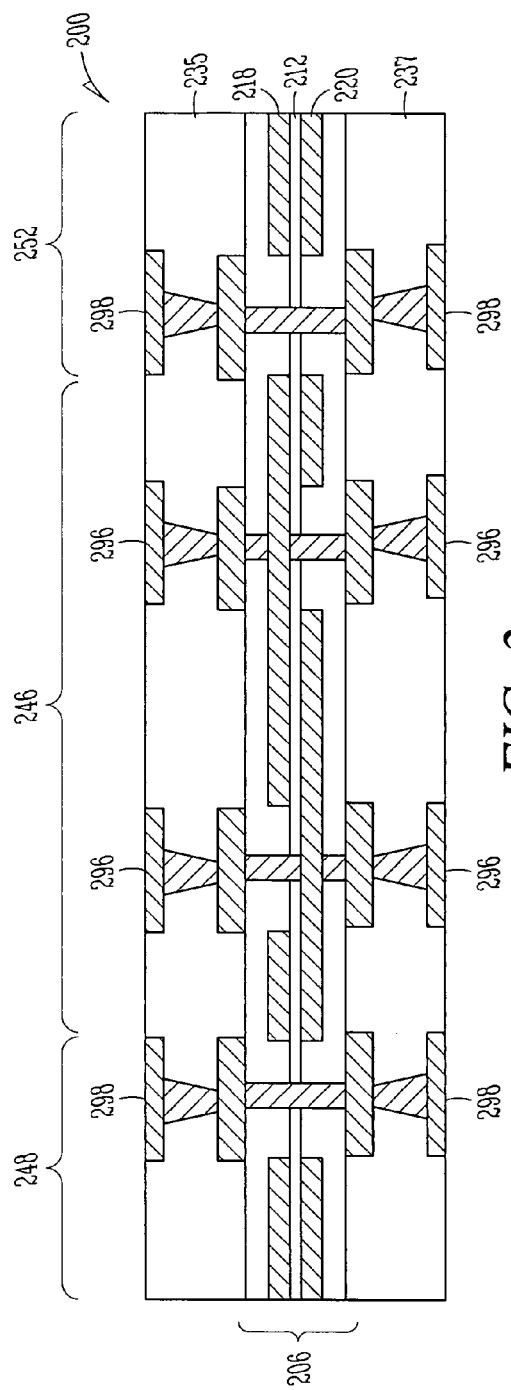
FIG. 2 is a cross-section elevation of an organic substrate thin-film capacitor composite package according to an embodiment.

FIG. 2 is a cross-section elevation of an organic substrate thin-film capacitor composite package 200 according to an embodiment. The OS TFCC package 200 is similar in construction as the OS TFCC 106 depicted in FIG. 1G, and additional structure has been added thereto. An OS TFCC core is depicted as encompassed by a bracket 206.

An upper second film 235 is depicted on the upper side of the OS TFCC core 206. A lower second film 237 is depicted on the lower side of the OS TFCC core 206. A plurality of terminals is also depicted, both on the upper and the lower sides, and they are represented either as capacitor terminals 296, or as power or signal vias 298.

In an embodiment, the OS TFCC package 200 includes only the capacitor structure in the intersection of the brackets that include the OS TFCC core 206 and a first region 246. In an embodiment, the OS TFCC package 200 includes the capacitor structure and PWB traces region of the bracket that include the OS TFCC core 206 when viewed laterally. In an embodiment, the OS TFCC package 200 includes only the capacitor structure in the intersection of the brackets that include the OS TFCC core 206 and a second region 248. In an embodiment, the OS TFCC package 200 includes only the capacitor structure in the intersection of the brackets that include the OS TFCC core 206 and a third region 252.

In an embodiment, PWB traces are disposed within the upper second film 235 and in the lower second film 237.

Figure 3:
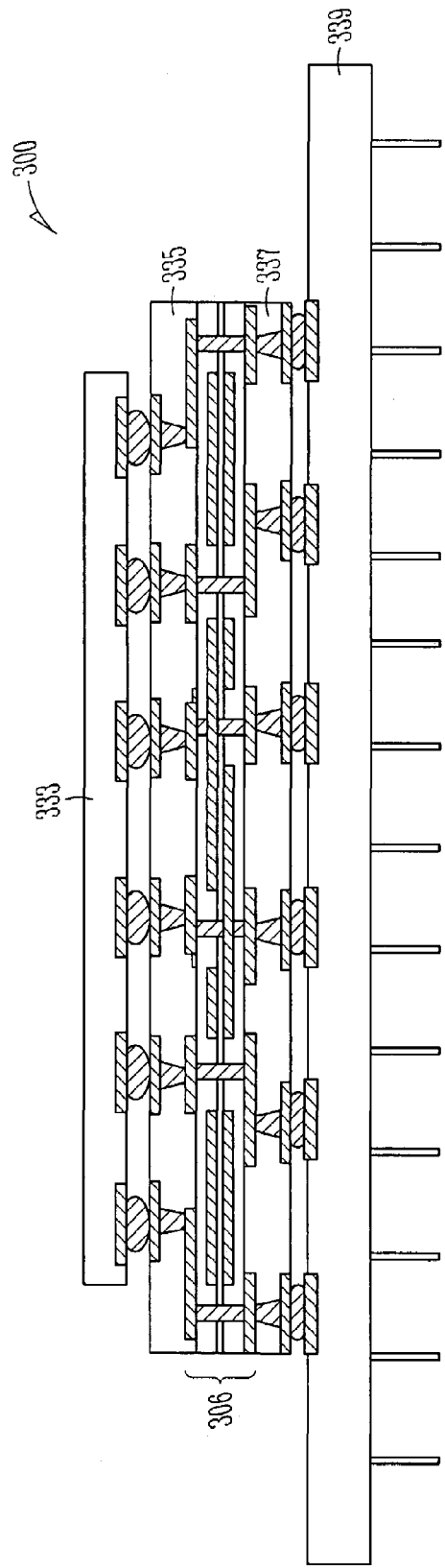
FIG. 3 is a cross-section elevation of an organic substrate thin-film capacitor composite die-and-interposer package according to an embodiment.

FIG. 3 is a cross-section elevation of an organic substrate thin-film capacitor composite die-and-interposer package 300 according to an embodiment. The package 300 includes an OS TFCC core 306 such as the OS TFCC 106 depicted in FIG. 1G. An upper second film 335 is depicted on the upper side of the OS TFCC core 306. A lower second film 337 is depicted on the lower side of the OS TFCC core 306.

In an embodiment, a microelectronic die 333 is disposed above the OS TFCC 306, and it is pinned out through the upper second film 335. In an embodiment, an interposer 339 is disposed below the OS TFCC 306, and it is pinned out through the lower second film 337. Accordingly, the OS TFCC 306 includes an integral plate capacitor structure and also integral traces for connecting a die 333 to an interposer 339.

Figure 4:
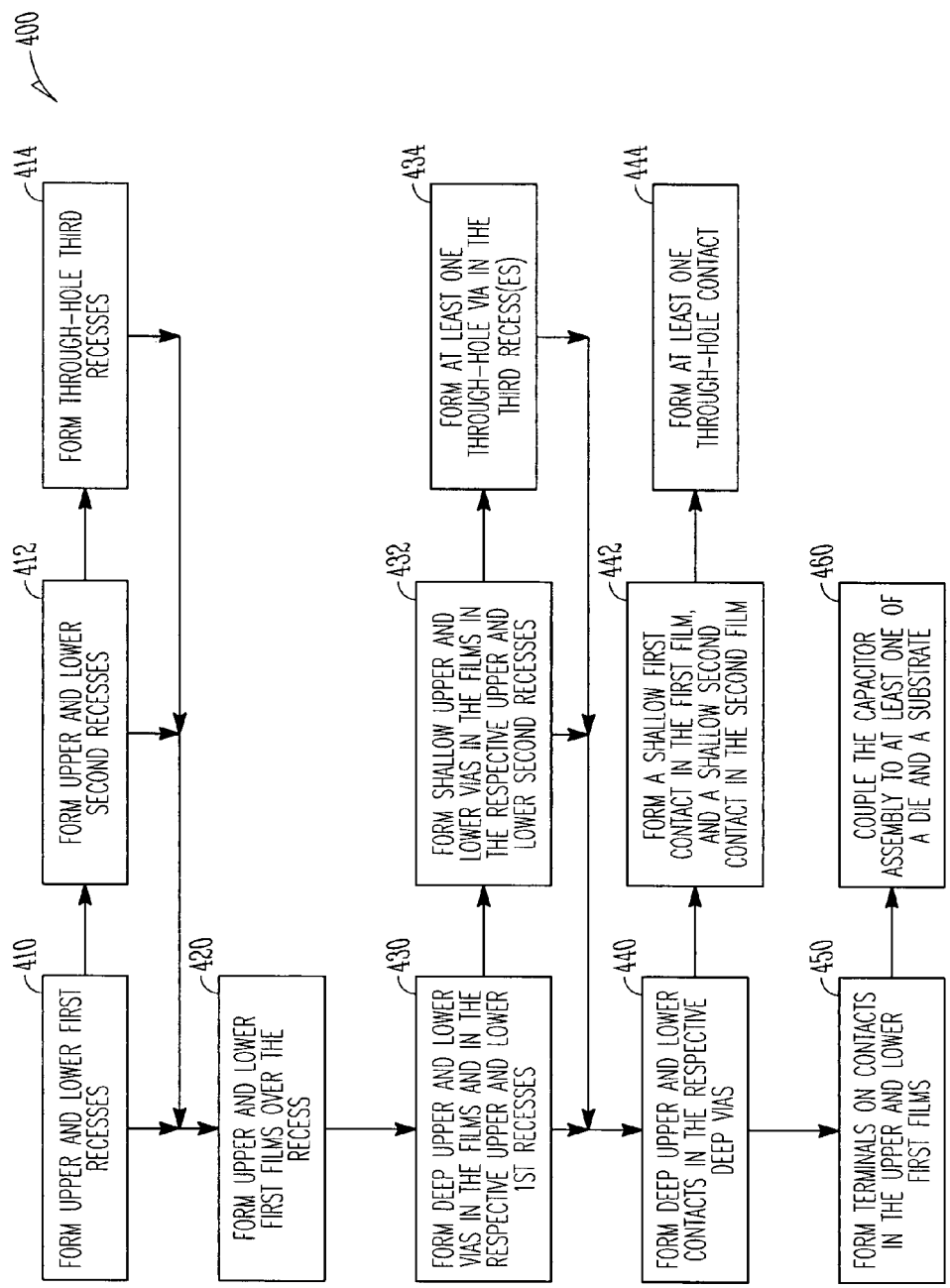
FIG. 4 is a process flow diagram according to various embodiments.

FIG. 4 is a process flow diagram according to various embodiments.

At 410, the process includes forming an upper and lower first recesses in a laminate. By way of non-limiting example and in reference to FIG. 1B, the upper first recess 122 and the lower first recess 124 are formed in the laminate 110 by a process such as chemical etching, laser drilling, or patterning the plate material upon the dielectric center film 112.

At 412 the process includes forming upper and lower second recesses in the laminate. At 414, the process includes forming first and second through-hole recesses.

At 420, the process includes forming upper and lower first films over the upper plate and the lower plates, respectively. By way of non-limiting example, the upper first film 134 and the lower first film 128 are spun on and cured. By way of non-limiting example, the upper first film 134 and the lower first film 128 are spread on as green barium strontium titanate (BST) material, and subsequently fired further up the line of the process. By way of a non-limiting example, the upper and lower films are laminated thermosetting (b-staged) or thermoplastic polymer films.

At 430, the process includes forming a deep upper via in the upper first recess, and forming a deep lower via in the lower first recess. By way of non-limiting example, the upper film 134 and the lower film 128 are dielectric materials, and the deep upper via 138 and the deep lower via 142 are formed by laser drilling. Other methods can be used depending upon the process conditions and the expected duty of the capacitor composite.

At 432, the process alternatively includes forming a shallow upper via in the upper film and a shallow lower via in the lower film. By way of non-limiting example, the process includes laser drilling to form both the deep upper via 138 and the shallow upper via 140. In the case of the deep upper via 138, the laser drilling stops on the lower plate 120. In the case of the shallow upper via 140, the laser drilling stops on the upper plate 118. In the case of the deep lower via 142, the laser drilling stops on the upper plate 118. In the case of the shallow lower via 144, the laser drilling stops on the lower plate 120. In an embodiment, processes 430 and 432 are carried out substantially simultaneously.

At 434, the process includes forming first and second through-hole vias. By way of non-limiting example, the process includes punching the entire structure to form the first and second through-hole vias 150 and 154, respectively. By way of non-limiting example, the process includes forming the through-vias with laser or mechanical drilling.

At 440, the process includes forming at least one contact in a via. By way of non-limiting example, the deep first contact 156 and the deep second contact 160 are formed by electroplating, by imposing a cathodic character upon the plates 118 and 120. At 442 the process includes forming a shallow first contact in the first film and a shallow second contact in the second film. At 444, the process includes forming at least one through-hole contact in the laminate.

At 450, the process includes forming at least one terminal at the at least one contact. By way of non-limiting example, the upper first terminal 146 is formed at the deep first contact 156, and the lower first terminal 150 is formed at the deep second contact 160.

At 460 the process includes a method of coupling the OS TFCC to at least one of a substrate and a die. By way of non-limiting example, the OS TFCC 106 is coupled to the substrate 156.

Figure 5:
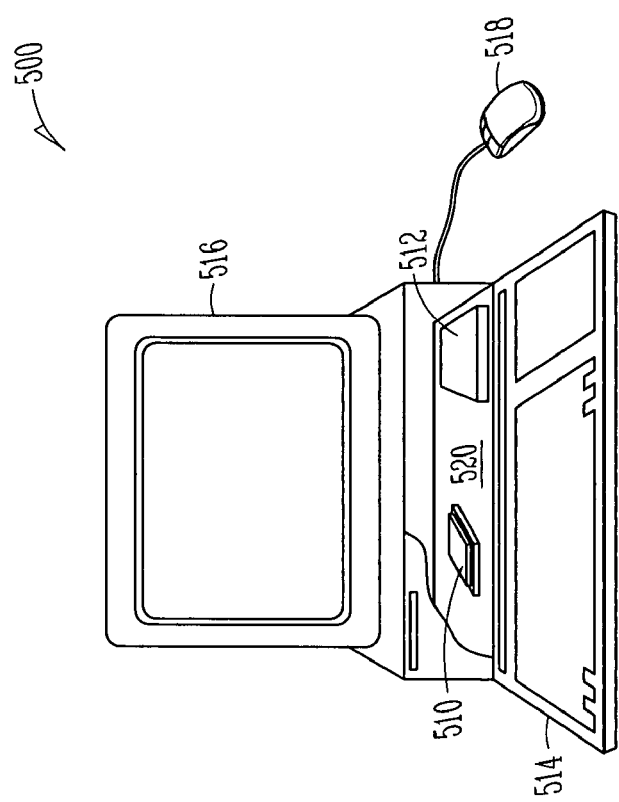
FIG. 5 is a depiction of a computing system according to an embodiment.

FIG. 5 is a depiction of a computing system according to an embodiment. One or more of the foregoing embodiments of an OS TFCC and/or a TFC package may be utilized in a computing system, such as the computing system 500 of FIG. 5. The computing system 500 includes at least one processor, which is enclosed in a package 510 and a data storage system 512 for example, for a data storage device such as dynamic random access memory, polymer memory, flash memory, and phase-change memory. The computing system 500 also includes at least one input device such as a keyboard 514, and at least one output device such as a monitor 516, for example. The computing system 500 includes a processor that processes data signals, and may include, for example, a microprocessor, available from Intel Corporation. In addition to the keyboard 514, the computing system 500 can include another user input device such as a mouse 518, for example.

For purposes of this disclosure, a computing system 500 embodying components in accordance with the claimed subject matter may include any system that utilizes an OS TFCC and/or a TFC package, which may be coupled to a mounting substrate 520. In an embodiment, the OS TFCC and/or a TFC package is in the package 510. In an embodiment, the OS TFCC and/or a TFC package is in the package 510 and is coupled to a die, for example, as depicted in either of FIGS. 2 and 3. The OS TFCC and/or a TFC composite can also be coupled to the mounting substrate 520 for a die that contains a digital signal processor (DSP), a micro-controller, an application specific integrated circuit (ASIC), or a microprocessor.

Embodiments set forth in this disclosure can be applied to devices and apparatuses other than a traditional computer. For example, a die can be packaged with an embodiment of the OS TFCC and/or a TFC composite and placed in a portable device such as a wireless communicator or a hand-held device such as a personal digital assistant and the like. Another example is a die that can be packaged with a OS TFCC and/or a TFC composite and placed in a vehicle such as an automobile, a locomotive, a watercraft, an aircraft, or a spacecraft.

The Abstract is provided to comply with 37 C.F.R. § 1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   in a first region of a board laminate:
      forming upper and lower first capacitor-access recesses (CARs), the board laminate including a dielectric center film with upper and lower sides; and upper and lower plates on the upper and lower sides, respectively;
      forming upper and lower films over the respective upper and lower plates;
      forming a deep upper via in the upper first CAR, a deep lower via in the lower first CAR, wherein the deep upper via exposes the lower plate from the first side and the deep lower via exposes the upper plate from the second side;
      forming a deep upper contact in the deep upper via and a deep lower contact in the deep lower via;
      forming an upper first terminal at the deep upper contact and a lower first terminal at the deep lower contact; and
   in a second region of the board laminate:
      forming at least one of a power and a signal via.

2. The process of claim 1, further including:
   forming a capacitor shallow upper via in the upper film, wherein the capacitor shallow upper via exposes the upper plate from the upper side; and forming a capacitor shallow lower via in the lower film, wherein the capacitor shallow lower via exposes the lower plate from the lower side.

3. The process of claim 1, wherein in the second region, forming at least one of a power via and a signal via, the process includes:
  forming upper and lower power or signal first recesses; followed by
  forming the upper and lower films over the upper and lower plates, respectively; followed by
  forming the at least one of a power via and a signal via in the upper and lower power or signal first recesses.

4. The process of claim 1, wherein forming the upper first CAR includes:
  forming the upper first CAR in the upper plate at a first location; and
  forming the lower first CAR in the lower plate at a second location that is laterally offset from the first location.

5. The process of claim 1, wherein forming the upper first CAR includes:
  forming the upper first CAR in the upper plate at a first location; and
  forming the lower first CAR in the lower plate at a second location that is laterally offset from the first location, the process further including:
    forming a capacitor shallow upper via in the upper film; and
    forming a capacitor shallow lower via in the lower film.

6. The process of claim 1, wherein forming at least one of power via and a signal via further includes:
  forming an upper second recess in the upper plate and spaced apart from the upper first CAR; and
  forming a lower second recess in the lower plate and spaced apart from the lower first CAR in the lower plate, wherein the upper second recess and the lower second recess are vertically aligned.

7. The process of claim 1, wherein forming at least one of power via and a signal via further includes:
  forming an upper second recess in the upper plate and spaced apart from the upper first CAR;
  forming a lower second recess in the lower plate and spaced apart from the lower first CAR in the lower plate, wherein the upper second recess and the lower second recess are vertically aligned; and
  forming a power or signal via through the upper second recess and the lower second recess.

8. The process of claim 1, wherein forming at least one of power via and a signal via further includes:
  forming an upper second recess in the upper plate and spaced apart from the upper first CAR;
  forming a lower second recess in the lower plate and spaced apart from the lower first CAR in the lower plate, wherein the upper second recess and the lower second recess are vertically aligned; and
  forming a power or signal via through the upper second recess and the lower second recess, wherein forming the power or signal via is carried out in a single operation.

9. The process of claim 1, wherein forming at least one of power via and a signal via further includes:
  forming an upper second recess in the upper plate and spaced apart from the upper first CAR;
  forming a lower second recess in the lower plate and spaced apart from the lower first CAR in the lower plate, wherein the upper second recess and the lower second recess are vertically aligned;
  forming an upper third recess in the upper plate and spaced apart from the upper first CAR; and
  forming a lower third recess in the lower plate and spaced apart from the lower first CAR in the lower plate, wherein the upper third recess and the lower third recess are vertically aligned.

10. The process of claim 1, wherein forming at least one of power via and a signal via further includes:
  forming an upper second recess in the upper plate and spaced apart from the upper first CAR;
  forming a lower second recess in the lower plate and spaced apart from the lower first CAR in the lower plate, wherein the upper second recess and the lower second recess are vertically aligned;
  forming an upper third recess in the upper plate and spaced apart from the upper first CAR;
  forming a lower third recess in the lower plate and spaced apart from the lower first CAR in the lower plate, wherein the upper third recess and the lower third recess are vertically aligned; and
  forming a power or signal via in each of the second and third recesses, wherein forming the power of signal vias is carried out in a single operation.

11. The process of claim 1, wherein forming at least one of power via and a signal via further includes:
  forming a power or signal via in the laminate, including forming a power or signal in the laminate is carried out in a single operation.

12. The process of claim 1, further including coupling a substrate to the lower first terminal and the via lower terminal.

13. The process of claim 1, further including:
  coupling a substrate to the lower first terminal, wherein a B-staged polymer is processed between the substrate, and the lower first terminal.

14. The process of claim 1, further including coupling a die to the upper first terminal.

15. The process of claim 1, further including:
  coupling a substrate to the lower first terminal, wherein a B-staged polymer is processed between the substrate and the lower first terminal; and
  coupling a die to the upper first terminal.

16. The process of claim 1, further including:
  forming an upper second terminal at the shallow first contact; and
  forming a lower second terminal at the shallow second contact.

17. A thin-film capacitor assembly comprising:
in a first region:
  a laminate including a dielectric center film with upper and lower sides;
  an upper plate on the upper side; and a lower plate on the lower side;
  a first upper capacitor-access recess (CAR) in the upper plate that exposes the dielectric center film, and a first lower CAR in the lower plate that exposes the dielectric center film;
  an upper film above and on the upper plate and a deep upper via in the upper film, wherein the deep upper via exposes the lower plate through the first upper CAR;
  a lower film below and on the lower plate and a deep lower via in the lower film, wherein the deep lower via exposes the upper plate in the first lower CAR;
  a deep upper contact in the deep upper via;
  a deep lower contact in the deep lower via; and
in a second region spaced apart from the first region:

at least one of a power and signal via that penetrates the dielectric center; and in a second region spaced apart from the first region a via contact in the at least one of power or signal via.

18. The thin-film capacitor assembly of claim 17, further including;

a deep upper contact terminal above an on the deep upper contact;

a deep lower contact terminal below and on the deep lower contact;

a via upper terminal above and on the via contact on the upper side; and a via lower terminal below and on the via contact on the lower side.

19. The thin-film capacitor assembly of claim 17, further including:

a shallow upper via in the upper film, wherein the shallow upper via exposes the upper plate from the upper side;

a shallow upper contact in the shallow upper via;

a shallow lower via in the lower film, wherein the shallow lower via exposes the lower plate from the lower side; and a shallow lower contact in the shallow lower via.

20. The thin-film capacitor assembly of claim 17, further including a substrate coupled to the deep lower contact and the via contact.

21. The thin-film capacitor assembly of claim 17, further including:

a substrate coupled to the deep lower contact and the via contact; and a polymer film between the substrate and the second side.

22. The thin-film capacitor assembly of claim 17, further including a die coupled to the deep upper contact and the via contact.

23. The thin-film capacitor assembly of claim 17, further including:

a substrate coupled to the deep lower contact and the via contact;

a polymer film between the substrate and the second side; and a die coupled to the deep upper contact and the via contact.

24. A system comprising:

in a first region:

a laminate including a dielectric center film with upper and lower sides;

an upper plate on the upper side; and a lower plate on the lower side;

a first upper capacitor-access recess (CAR) in the upper plate that exposes the dielectric center film, and a first lower CAR in the lower plate that exposes the dielectric center film;

an upper film above and on the upper plate and a deep upper via in the upper film, wherein the deep upper via exposes the lower plate through the first upper CAR;

a lower film below and on the lower plate and a deep lower via in the lower film, wherein the deep lower via exposes the upper plate in the first lower CAR;

a deep upper contact in the deep upper via;

a deep lower contact in the deep lower via; and in a second region spaced apart from the first region:

at least one of a power and signal via that penetrates the dielectric center;

a via contact in the at least one of power or signal via;

a die coupled to the deep upper contact; and a dynamic random access storage device coupled to the die.

25. The system of claim 24, further including a substrate coupled to the deep lower contact and the via contact.

26. The system of claim 24, further including:

a substrate coupled to the deep lower contact and the via contact; and a polymer film between the substrate and the second side.

* * * * *